(12) United States Patent
Chang et al.

(10) Patent No.: US 6,739,820 B2
(45) Date of Patent: May 25, 2004

(54) STOCKER APPARATUS WITH INCREASED INPUT/OUTPUT CAPACITY

(75) Inventors: Yu-Yen Chang, Taipei (TW); Kuo-Chen Lin, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 286 days.

(21) Appl. No.: 09/761,296

(22) Filed: Jan. 16, 2001

(65) Prior Publication Data

US 2002/0094256 A1 Jul. 18, 2002

(51) Int. Cl.[7] .............................................. B65G 1/133
(52) U.S. Cl. .................................................... 414/217.1
(58) Field of Search ............................. 414/217, 217.1, 414/222, 939, 940

(56) References Cited

U.S. PATENT DOCUMENTS

| | | | |
|---|---|---|---|
| 4,986,715 A | * | 1/1991 | Asakawa .................... 211/163 |
| 5,570,990 A | | 11/1996 | Bonora et al. |
| 5,971,696 A | * | 10/1999 | Endo et al. ................. 414/217 |
| 5,980,183 A | | 11/1999 | Fosnight |
| 6,050,891 A | * | 4/2000 | Nering ........................ 414/939 |
| 6,122,566 A | * | 9/2000 | Nguyen et al. ............. 438/908 |
| 6,142,722 A | * | 11/2000 | Genov et al. ............... 414/217 |
| 6,283,692 B1 | * | 9/2001 | Perlov et al. ............. 414/217.1 |

* cited by examiner

Primary Examiner—Eileen D. Lillis
Assistant Examiner—Charles A. Fox
(74) Attorney, Agent, or Firm—Tung & Associates

(57) ABSTRACT

Within both a stocker apparatus and a method for operating the stocker apparatus there is employed: (1) a minimum of six input/output ports; (2) an array of storage locations for storing an array of work in process (WIP) product units; and (3) a random access transportation means for transporting a work in process (WIP) product unit at least bidirectionally between the minimum of six input/output ports and a storage location within the array of storage locations. Within the stocker apparatus and the method, the minimum of six input/output ports provides for more efficient operation of the stocker apparatus.

12 Claims, 1 Drawing Sheet

STOCKER APPARATUS WITH INCREASED INPUT/OUTPUT CAPACITY

BACKGROUND OF THE INVENTION

1. Field of the Invention

The present invention relates generally to stocker apparatus, as employed within multi-step manufacturing processes. More particularly, the present invention relates to stocker apparatus with enhanced efficiency, as employed within multi-step manufacturing processes.

2. Description of the Related Art

Integral to the implementation of complex non-linear multi-step manufacturing processes, such as but not limited to complex non-linear multi-step microelectronic manufacturing processes, further such as but not limited to complex non-linear multi-step semiconductor integrated circuit microelectronic fabrication manufacturing processes, is the use of stocker apparatus for purposes of assisting in the management and sequencing of work in process (WIP) workload under manufacturing conditions that generally include competing product scheduling priorities for multiple product lines fabricated in conjunction with multiple product routings within a single manufacturing facility.

Within the context of complex non-linear multi-step microelectronic manufacturing processes and in particular within the context of complex non-linear multi-step semiconductor integrated circuit microelectronic fabrication processes, stocker apparatus are typically designed and fabricated to accommodate, stock and store a multiplicity of microelectronic fabrication substrate carriers, such as semiconductor substrate carriers, each in turn carrying a multiplicity of microelectronic fabrication substrates, such as semiconductor substrates, in a fashion that provides for random access of the multiplicity of microelectronic fabrication substrate carriers, and the microelectronic substrates carried therein, such as to facilitate optimal non-linear work in process (WIP) workload flow within a complex non-linear multi-step microelectronic manufacturing process as employed within an advanced microelectronic fabrication facility.

While stocker apparatus are thus clearly desirable within the context of complex non-linear multi-step manufacturing processes, such as but not limited to complex non-linear multi-step microelectronic manufacturing processes, and often essential to effectively implement complex non-linear multi-step manufacturing processes, such as but not limited to complex non-linear multi-step microelectronic manufacturing processes, stocker apparatus are nonetheless not entirely without problems in the art of complex non-linear multi-step manufacturing processes, such as but not limited to complex non-linear multi-step microelectronic manufacturing processes.

In that regard, insofar as within the context of complex non-linear multi-step manufacturing processes stocker apparatus will typically by their very nature not maintain an ordered stocking of work in process (WIP) workload, a stocker apparatus will upon increased process demand within a complex non-linear multi-step manufacturing process often provide a bottleneck in operation of the complex non-linear multi-step manufacturing process.

It is thus desirable in the art of complex non-linear multi-step manufacturing processes, such as but not limited to complex non-linear multi-step microelectronic manufacturing processes, further such as but not limited to complex non-linear multi-step semiconductor integrated circuit microelectronic fabrication manufacturing processes, to provide stocker apparatus with enhanced efficiency such that upon increased process demand with respect to a stocker apparatus there is minimal impact to a complex non-linear multi-step manufacturing process within which is employed the stocker apparatus.

It is towards the foregoing object that the present invention is directed.

Various stocker apparatus having desirable properties, as well as stocker systems having incorporated therein stocker apparatus having desirable properties, have been disclosed in the art of complex non-linear multi-step manufacturing processes.

For example, Asakawa, in U.S. Pat. No. 4,986,715, discloses a stocker apparatus for use within a complex non-linear multi-step semiconductor integrated microelectronic fabrication process, wherein the stocker apparatus provides for enhanced efficiency and reduced semiconductor integrated circuit microelectronic fabrication personnel interference when stocking within the stocker apparatus a series of semiconductor substrate carriers having carried therein a series of semiconductor substrates which in turn are fabricated within the complex non-linear multi-step semiconductor integrated circuit microelectronic fabrication process. To realize the foregoing object, a preferred embodiment of the stocker apparatus comprises a series of vertically stacked rotating multi-position circular racks, a series of co-aligned open central portions of which define a core through which is provided a clean air flow to purge through the series of semiconductor substrates carried within the series of semiconductor substrate carriers in turn positioned within the series of positions defined within the series of stacked rotating multi-position circular racks.

In addition, Bonora et al., in U.S. Pat. No. 5,570,990, discloses a stocker apparatus for use within a complex non-linear multi-step semiconductor integrated circuit microelectronic fabrication process, wherein the stocker apparatus provides for enhanced manufacturing flexibility when stocking a semiconductor integrated circuit microelectronic fabrication tool employed for fabricating a semiconductor integrated circuit microelectronic fabrication while employing the complex non-linear multi-step semiconductor integrated circuit microelectronic manufacturing process. To realize the foregoing object, the stocker apparatus comprises a human guided mobile stocker apparatus fabricated in the form of a pushcart, wherein the human guided stocker apparatus further comprises a semi-motorized transport arm in conjunction with a data processor device and a data communications device.

Finally, Fosnight, in U.S. Pat. No. 5,980,183, discloses a stocker system having incorporated therein a stocker apparatus, wherein the stocker system having incorporated therein the stocker apparatus may be employed for stocking within a complex non-linear multi-step semiconductor integrated circuit microelectronic fabrication process a series of related semiconductor integrated circuit microelectronic fabrication tools assembled within a single semiconductor integrated circuit microelectronic fabrication bay within a semiconductor integrated circuit microelectronic fabrication facility. To realize the foregoing object, the stocker system includes within the single semiconductor integrated circuit microelectronic fabrication bay in addition to, and integrated with, the stocker apparatus: (1) a pair of shuttles for transporting a series of semiconductor substrate carriers between the series of related semiconductor integrated circuit microelectronic fabrication tools and the stocker apparatus; and (2) a series of additional localized storage shelving units located adjacent to at least some of the series of related semiconductor integrated circuit microelectronic fabrication tools.

Desirable in the art of complex non-linear multi-step manufacturing processes, such as complex non-linear multi-step microelectronic manufacturing processes, further such as complex non-linear multi-step semiconductor integrated circuit microelectronic manufacturing processes, are stocker apparatus that may be operated with enhanced efficiency.

It is towards the foregoing object that the present invention is directed.

SUMMARY OF THE INVENTION

A first object of the present invention is to provide a stocker apparatus for use within a complex non-linear multi-step manufacturing process.

A second object of the present invention is to provide a stocker apparatus in accord with the first object of the present invention, wherein the stocker apparatus may be operated with enhanced efficiency.

A third object of the present invention is to provide a stocker apparatus in accord with the first object of the present invention and the second object of the present invention, wherein the stocker apparatus is readily fabricated.

In accord with the objects of the present invention, there is provided by the present invention a stocker apparatus and a method for operating the stocker apparatus. The stocker apparatus in accord with the present invention comprises in a first instance a minimum of six input/output ports. In addition, the stocker apparatus of the present invention also comprises an array of storage locations for storing an array of work in process (WIP) product units within the stocker apparatus. Finally, the stocker apparatus in accord with the present invention also comprises a random access transportation means for transporting a work in process (WIP) product unit at least bidirectionally between the minimum of six input/output ports and a storage location within the array of storage locations.

The stocker apparatus of the present invention contemplates a method for operating the stocker apparatus of the present invention.

The present invention provides a stocker apparatus that may be employed within a complex non-linear multi-step manufacturing process, wherein the stocker apparatus may be operated with enhanced efficiency.

The stocker apparatus of the present invention realizes the foregoing object by employing within the stocker apparatus of the present invention: (1) a minimum of six input/output ports; (2) an array of storage locations for storing an array of work in process (WIP) product units; and (3) a random access transportation means for transporting a work in process (WIP) product unit at least bidirectionally between the minimum of six input/output ports and a storage location within the array of storage locations. By employing within the stocker apparatus of the present invention the minimum of six input/output ports, the stocker apparatus of the present invention may operate with enhanced efficiency insofar as there is reduced at least when manually introducing a work in process (WIP) product unit into the stocker apparatus or manually removing a work in process (WIP) product unit from the stocker apparatus a bottleneck delay with respect to the stocker apparatus insofar as the stocker apparatus of the present invention provides an enhanced number (i.e., a minimum of six) of input/output ports within the stocker apparatus.

The stocker apparatus of the present invention may be readily fabricated.

As is illustrated within the context of the Description of the Preferred Embodiment which follows, a stocker apparatus in accord with the present invention may be fabricated in general employing modification of a stocker apparatus as is otherwise generally conventional in the art of complex non-linear multi-step manufacturing processes. Since a stocker apparatus in accord with the present invention is thus generally structurally similar to a stocker apparatus as is otherwise generally conventional in the art of complex non-linear multi-step manufacturing processes, the stocker apparatus of the present invention may be readily fabricated.

BRIEF DESCRIPTION OF THE DRAWINGS

The objects, features and advantages of the present invention are understood within the context of the Description of the Preferred Embodiment, as set forth below.

The Description of the Preferred Embodiment is understood within the context of the accompanying drawings, which form a material part of this disclosure, wherein.

DESCRIPTION OF THE PREFERRED EMBODIMENT

The present invention provides a stocker apparatus that may be employed within a complex non-linear multi-step manufacturing process, wherein the stocker apparatus may be operated with enhanced efficiency.

The present invention realizes the foregoing object by employing within the stocker apparatus: (1) a minimum of six input/output ports; (2) an array of storage locations for storing an array of work in process (WIP) product units; and (3) a random access transportation means for transporting a work in process (WIP) product unit at least bidirectionally between the minimum of six input/output ports and a storage location within the array of storage locations. By employing within the stocker apparatus of the present invention the minimum of six input/output ports, the stocker apparatus of the present invention may operate with enhanced efficiency insofar as there is reduced at least when manually introducing a work in process (WIP) product unit into the stocker apparatus or manually removing a work in process (WIP) product unit from the stocker apparatus a bottleneck delay with respect to the stocker apparatus insofar as the stocker apparatus of the present invention provides an enhanced number (i.e., a minimum of six) of input/output ports within the stocker apparatus.

Although the stocker apparatus of the present invention may be employed for stocking work in process (WIP) product units within complex non-linear multi-step manufacturing processes including but not limited to complex non-linear multi-step mechanical manufacturing processes, complex non-linear multi-step electrical manufacturing processes, complex non-linear multi-step electro-mechanical manufacturing processes and complex non-linear multi-step electronic manufacturing processes, the preferred embodiment of present invention typically and preferably provides a stocker apparatus, and a method for operation thereof, as employed within a complex non-linear multi-step microelectronic manufacturing process as employed for fabricating a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
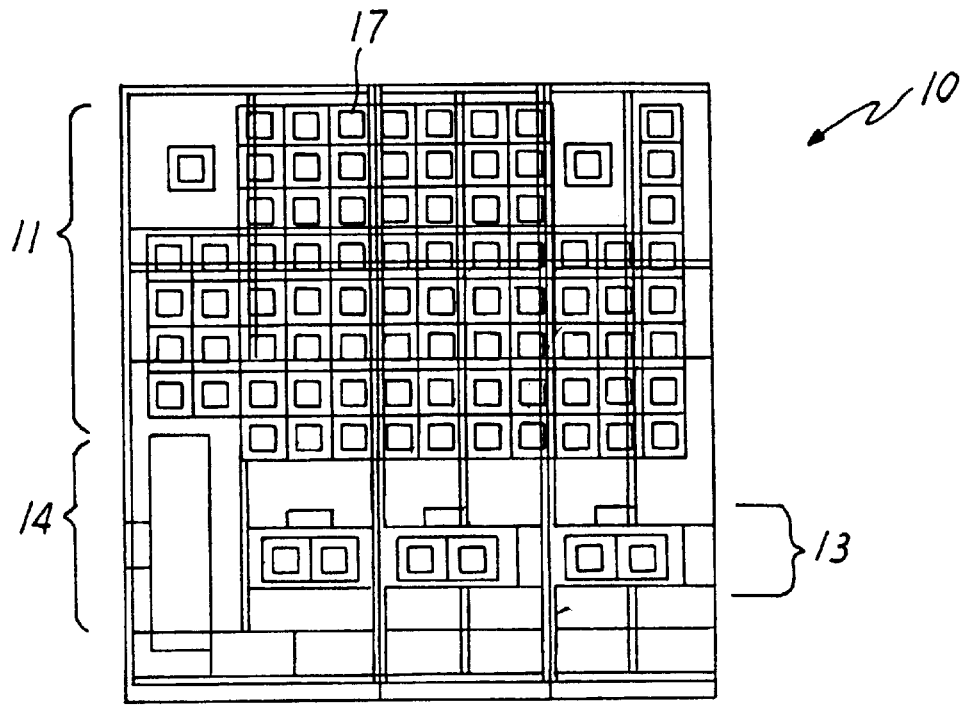
FIG. 1 shows a schematic side view diagram of a stocker apparatus in accord with a preferred embodiment of the present invention.
Figure 2:
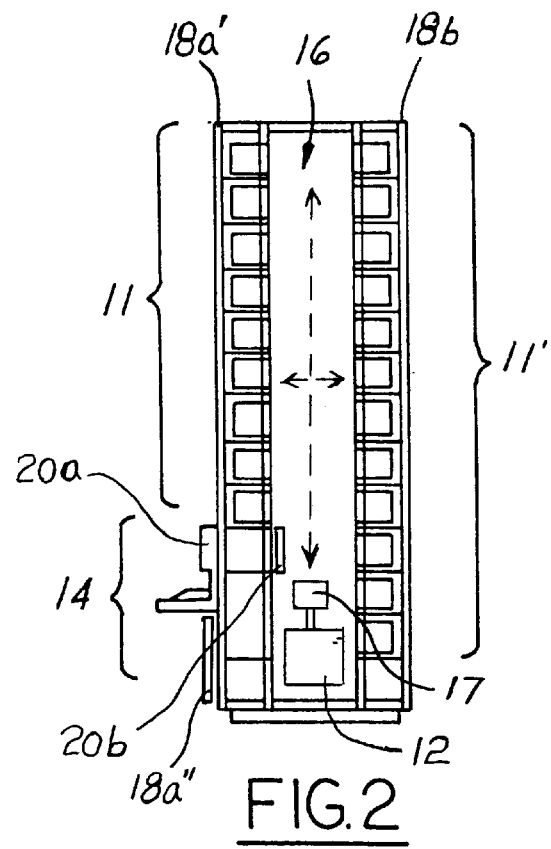
FIG. 2 shows a schematic front view diagram of a stocker apparatus in accord with a preferred embodiment of the present invention.

Referring now to FIG. 1 and FIG. 2, there is shown a pair of schematic diagrams illustrating, respectively, a side view and a front view of a stocker apparatus in accord with a preferred embodiment of the present invention.

Referring now to FIG. 1, there is shown a side view generally of a stocker apparatus 10 in accord with a preferred embodiment of the present invention, where the stocker apparatus 10 comprises a first bidirectional array of storage locations 11, each formed generally in the shape of a cubicle. In turn, each of the first bidirectional array of storage locations 11 formed generally in the shape of the cubicle is intended to store and stock a work in process (WIP) product unit 17 that may be carried within a work in process product (WIP) product carrier. Within the preferred embodiment of the present invention when the stocker apparatus 10 whose schematic side view diagram is illustrated in FIG. 1 is employed within a complex non-linear multi-step semiconductor integrated circuit microelectronic fabrication process, the work in process (WIP) product carrier is typically and preferably a semiconductor substrate carrier that typically and preferably carries up to twenty-five semiconductor substrates as a work in process (WIP) product unit. Further, within the preferred embodiment of the present invention when the stocker apparatus 10 whose schematic side view diagram is illustrated in FIG. 1 is employed within a complex non-linear multi-step semiconductor integrated circuit microelectronic fabrication manufacturing process, the semiconductor substrate carrier that carries the semiconductor substrate work in process (WIP) product unit is in turn typically and preferably carried within an enclosed super carrier box, where the enclosed super carrier box is typically and preferably designed to semiconductor tooling standard mechanical interface (SMIF) specifications.

Shown also within the stocker apparatus 10 whose schematic side view diagram is illustrated in FIG. 1 is a series of six input/output ports 13 which is employed for introducing into the stocker apparatus 10 a series of work in process (WIP) product units and removing from the stocker apparatus 10 the series of work in process (WIP) product units. Within the stocker apparatus and method of the present invention there is employed a minimum of six input/output ports, such as the series of six input/output ports 13.

Although not specifically illustrated within the schematic side view diagram of the stocker apparatus of FIG. 1, a random access transportation means, such as but not limited to a random access robot, is typically and preferably employed for transporting a work in process (WIP) product unit, such as a work in process (WIP) product unit positioned within one of the minimum of six input/output ports 13, to a storage location within the first bidirectional array of storage locations 11.

Finally, there is also illustrated within the stocker apparatus 10 whose schematic side view diagram is illustrated in FIG. 1 an operator interface 14 which includes a controller which in turn controls the random access robot (which is not otherwise illustrated within the schematic side view diagram of FIG. 1).

Referring now to FIG. 2, there is shown a schematic diagram illustrating a front view of the stocker apparatus 10 whose schematic side view diagram is illustrated in FIG. 1.

Shown in FIG. 2 is a schematic front view diagram of the first bidirectional array of storage locations 11 having mirrored thereto a second bidirectional array of storage locations 11' that is separated from the first bidirectional array of storage locations 11 by a core 16 within which is positioned a random access robot 12 such as to access or store a work in process (WIP) product unit 17 within either the first bidirectional array of storage locations 11 or the second bidirectional array of storage locations 11'. There is also illustrated within the schematic front view diagram of FIG. 2 the operator interface 14.

Although the preferred embodiment of the present invention illustrates the present invention within the context of a stocker apparatus formed in a generally rectangular geometric configuration, where the stocker apparatus comprises the core 16 having positioned therein the random access robot 12 which is mobile within the core 16, the present invention may also be employed in general with respect to stocker apparatus of alternative geometric shapes, and wherein a random access transportation means, such as but not limited to a random access robot or other non-robotic random access transportation means, need not necessarily be fully mobile within the stocker apparatus. Such alternative geometric configurations may include, but are not limited to, circular configurations and regular polygonal configurations.

As is similarly understood by a person skilled in the art, and from a practical perspective, in order for a stocker apparatus in accord with the present invention to be more efficiently operative, a random access transportation means employed within the stocker apparatus will generally, but not necessarily exclusively, be positioned on the same side of a series of input/output ports as an array of storage locations which is employed for storing a series of work in process (WIP) product units within the stocker apparatus.

As is yet similarly understood by a person skilled in the art, and as is similarly also illustrated within the schematic diagrams of FIG. 1 and FIG. 2, a stocker apparatus in accord with the present invention and the preferred embodiment of the present invention will typically and preferably have covering its exterior dimensions a series of rigid exterior surface plates 18a', 18a'', 18b, 18c and 18d such as to physically isolate an array of storage locations within the stocker apparatus from a surrounding environment of process tools which are stocked while employing the stocker apparatus. Under such circumstances, the minimum of six input/output ports of the stocker apparatus of the present invention and the preferred embodiment of the present invention will typically and preferably each have incorporated therein a minimum of one door 20a (nominally coplanar with the rigid exterior surface plate) and preferably two doors 20a and 20b (one nominally coplanar with the rigid exterior surface plate and the other at an interior location of the input/output port) such as primarily to provide safe operation of the stocker apparatus with respect to operation of a random access robot operating within the stocker apparatus.

Finally, as is further understood by a person skilled in the art, the preferred embodiment of the present invention is illustrative of the present invention rather than limiting of the present invention. Revisions and modifications may be made to components, materials and dimensions employed for fabricating a stocker apparatus in accord with the preferred embodiment of the present invention while still providing a stocker apparatus in accord with the present invention and a method for operating the stocker apparatus in accord with the present invention, further in accord with the accompanying claims.

What is claimed is:

1. A stocker apparatus comprising:
   a minimum of six input/output ports;
   an array of storage locations for storing an array of work in process product units;
   a random access transportation means for transporting a work in process product unit at least bidirectionally between the minimum of six input/output ports and a storage location within the array of storage locations; and
   a series of rigid exterior surface plates covering the exterior dimensions of the stocker apparatus.

2. The stocker apparatus of claim 1 further comprising a controller for controlling the random access transportation means.

3. The stocker apparatus of claim 1 wherein the work in process product unit is selected from the group consisting of mechanical work in process product units, electrical work in process product units and electro-mechanical work in process product units.

4. The stocker apparatus of claim 1 wherein the work in process product unit is a microelectronic work in process product unit selected from the group consisting of integrated circuit microelectronic fabrication work in process product units, ceramic substrate microelectronic fabrication work in process product units, solar cell optoelectronic microelectronic fabrication work in process product units, sensor image array optoelectronic microelectronic fabrication work in process product units and display image array optoelectronic microelectronic fabrication work in process product units.

5. The stocker apparatus of claim 1 wherein the random access transportation means and the array of storage locations are both on the same side of the minimum of six input/output ports.

6. The stocker apparatus of claim 1 further comprising a minimum of one door each within the series of rigid exterior surface plates for accessing each of the minimum of six input/output ports.

7. A method for operating a stocker apparatus comprising:
   providing a stocker apparatus comprising:
   a minimum of six input/output ports;
   an array of storage locations for storing an array of work in process product units;
   a random access transportation means for transporting a work in process product unit at least bidirectionally between the minimum of six input/output ports and a storage location within the array of storage locations; and
   a series of rigid exterior surface plates covering a series of exterior dimensions of the stocker apparatus; and
   introducing into or retrieving from the stocker apparatus a work in process product unit.

8. The method of claim 7 wherein within the stocker apparatus the random access transportation means and the array of storage locations are both on the same side of the minimum of six input/output ports.

9. The method of claim 7 wherein by employing within the stocker apparatus the minimum of six input/output ports, the stocker apparatus may be operated more efficiently.

10. The method of claim 7 wherein the work in process product unit is selected from the group consisting of mechanical work in process product units, electrical work in process product units and electro-mechanical work in process product units.

11. The method of claim 7 wherein the work in process product unit is a microelectronic work in process product unit selected from the group consisting of integrated circuit microelectronic fabrication work in process product units, ceramic substrate microelectronic fabrication work in process product units, solar cell optoelectronic microelectronic fabrication work in process product units, sensor image array optoelectronic microelectronic fabrication work in process product units and display image array optoelectronic microelectronic fabrication work in process product units.

12. The method of claim 7 wherein the stocker apparatus further comprises a minimum of one door each within the series of rigid exterior surface plates for accessing each of the minimum of six input/output ports.

* * * * *